(12) United States Patent
Ojiro

(10) Patent No.: US 7,368,952 B2
(45) Date of Patent: May 6, 2008

(54) OUTPUT BUFFER CIRCUIT

(75) Inventor: Tsukasa Ojiro, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 96 days.

(21) Appl. No.: 11/111,732

(22) Filed: Apr. 22, 2005

(65) Prior Publication Data
US 2005/0237085 A1 Oct. 27, 2005

(30) Foreign Application Priority Data

Apr. 22, 2004 (JP) .............................. 2004-126421
Mar. 28, 2005 (JP) .............................. 2005-091100

(51) Int. Cl.
*H03K 19/094* (2006.01)
*H03K 19/0175* (2006.01)

(52) U.S. Cl. .......................................... 326/87; 326/86
(58) Field of Classification Search ............ 326/82–83, 326/86–87; 327/108–109
See application file for complete search history.

(56) References Cited

U.S. PATENT DOCUMENTS 5,089,722 A * 2/1992 Amedeo .................... 326/87
6,051,995 A * 4/2000 Pollachek .................... 326/87
6,366,867 B2 * 4/2002 Sine et al. .................. 702/107
2005/0237085 A1 * 10/2005 Ojiro ............................ 326/87

FOREIGN PATENT DOCUMENTS

JP    3-147418    6/1991
JP    10-75167    3/1998

* cited by examiner

*Primary Examiner*—James Cho
*Assistant Examiner*—Jason Crawford
(74) *Attorney, Agent, or Firm*—Young & Thompson

(57) ABSTRACT

An output buffer circuit includes a first output buffer section and a second output buffer section. The first output buffer section includes complementary semiconductors. The second output buffer section includes complementary semiconductors and is connected in parallel with the first output buffer section. The second output buffer section starts to output an second output signal after an output voltage of the output buffer circuit reaches a reference voltage indicative of one of an on-state and an off-state by a first output signal of the first output buffer section.

15 Claims, 9 Drawing Sheets

OUTPUT BUFFER CIRCUIT

BACKGROUND OF THE INVENTION

Field of the Invention

The present invention relates to an output buffer circuit. More particularly, the present invention relates to an output buffer circuit that drives an external load in a semiconductor integrated circuit device.

In the case that an output buffer circuit is used as, for example, a LED (light emitting diode) switch, a high electric current port, or a communication means for communication with external memory or the like, both enhancement in operating frequency and maintenance of a sufficient voltage level are required for the output buffer circuit.

In the case that the size of an output buffer constituting an output buffer circuit is reduced, the capacitance of a transistor is reduced. Therefore, the operation speed is increased, and the signal propagation delay time can be reduced. However, when the external load to be driven is high, the output voltage cannot be swung to a necessary level, so that a desired output voltage level cannot be satisfied.

Conversely, in the case that the size of the transistor is increased, even though the desired output voltage level can be satisfied, transient electric current causes, for example, an increase in switching noise and an increase in ringing occurring in the output waveform, when the transistor is abruptly turned ON. Alternately, when the transistor is slowly turned ON, even though the noise can be reduced, the signal-propagation delay time is increased, the desired operating frequency can not be obtained.

Hitherto, output buffer circuits have been proposed that are designed to satisfy such conflicting conditions for the enhancement in the operating frequency and the maintenance of the output voltage level. Among them, in Japanese Laid Open Patent Application JP H10-75167 A, an output buffer circuit configured of a plurality of parallel-connected output buffers.

This document discloses as follows. The function of the output buffer circuit having two CMOS inverters, specifically, a first CMOS inverter and a second CMOS inverter, is separated into a portion necessary to deal with the speed and a portion necessary to satisfy specifications of the output voltage level thereby to perform the output operation. Using this configuration, errors in operation due to power-supply noise can be restrained by downsizing the first CMOS inverter. Concurrently, when the load being driven by the output buffer is low, the parasitic capacitance is reduced by the downsized output buffer, whereby enhanced high speed is achieved. Additionally disclosed is that, required values of the output voltage level in the specifications can be achieved based on the output of the second CMOS inverter. It is further disclosed that with a delay circuit provided in a forestage of the second CMOS inverter, the second CMOS inverter starts driving after the first CMOS inverter has started driving.

Providing of the time difference between driving timings of the two CMOS inverters as in the output buffer circuit disclosed in the above-mentioned document is effective to reduce the switching noise. However, we have now discovered that simply operating the circuit with the time difference being provided between the driving timings of the two CMOS inverters is not sufficient to satisfy a desired operating frequency and to obtain a sufficient output voltage level while restraining the increase in the signal-propagation delay time, in the case of a high external load being driven by the output buffer circuit. In this case, problems to be solved still remains as described below.

FIG. 1 is a circuit diagram showing an example of a conventional output buffer circuit including two parallel-connected CMOS inverters in which a time difference is provided between driving timings of the two CMOS inverters.

In the output buffer circuit 40 in FIG. 1, an input terminal IN is connected to input terminals of predrivers 41 to 44 which are inverter circuits. Output terminal of the predriver 41 is connected to the gate of a P-channel MOS transistor P41. Output terminal of the predriver 42 is connected to the gate of an N-channel MOS transistor N41. The P-channel MOS transistor P41 and the N-channel MOS transistor N41 constitute a first CMOS inverter 45. Output terminal of the predriver 43 is connected to the gate of a P-channel MOS transistor P42. Output terminal of the predriver 44 is connected to the gate of an N-channel MOS transistor N42. The P-channel MOS transistor P42 and the N-channel MOS transistor N42 constitute a second CMOS inverter 46. The sources of the P-channel MOS transistors P41 and P42 are connected to a power-supply terminal VDD, and the drains thereof are connected to an output terminal OUT. The sources of the N-channel MOS transistors N41 and N42 are connected to a ground terminal VSS, and the drains thereof are connected to the output terminal OUT.

In this configuration, the first CMOS inverter 45 with a small capacitance is first driven by the small predrivers 41 and 42 to cause a flow of an electric current. Then, the second CMOS inverter 46 with a large capacitance is driven by the large predrivers 43 and 44 thereby to cause a flow of a high electric current.

FIGS. 2A and 2B are graphs showing output waveforms representing operation of the conventional output buffer circuit 40. In FIG. 2A, a vertical axis indicates a voltage, and a horizontal axis indicates a time. FIG. 2A shows output waveforms of the predrivers 41 and 43 (gate input waveforms of the P-channel MOS transistors P41 and P42) when the input signal to the input terminal IN has transitioned from "L" (VSS (ex. 0 V) in FIG. 2A) to "H" (VDD (ex. +5 V) in FIG. 2A). FIG. 2A further shows an output waveform that can be obtained by combining outputs of the P-channel MOS transistors P41 and P42. In this figure, L1 represents an output waveform of the predriver 41, L2 represents an output waveform of the predriver 43, and OUT represents an output waveform obtainable by combining outputs of the P-channel MOS transistors P41 and P42. Von represents a reference voltage at which a circuit being connected to the output buffer circuit turns ON, Vth represents a threshold voltage of a gate voltage necessary for the CMOS inverters 45 and 46 to start driving. FIG. 2B is a graph showing output electric current characteristic in the above-described event. In FIG. 2B, a vertical axis indicates an electric current, and a horizontal axis indicates a time.

As shown in FIGS. 2A and 2B, before time T1 at which the output waveform OUT reaches the Von level, the output voltage of the predriver 43, which is represented by L2, has reached the threshold voltage Vth at which the second CMOS inverter 46 starts outputting. The output waveform OUT reaches the Von level based on the outputs of both the first CMOS inverter 45 and the second CMOS inverter 46 driven with a delay from the first CMOS inverter 45. In this event, as shown in FIG. 2B, the electric current variation at the startup operation of the output buffer circuit 40 takes place such that the electric current peak value and the electric current variation rate are restrained to be low, whereby occurrence of switching noise can be reduced.

However, in the conventional output buffer circuit in which the time difference is provided between the driving timings of the two CMOS inverters, if the size of each predriver is increased to reduce the signal-propagation delay time, ringing in the output voltage waveform is increased that makes it difficult to use the output buffer circuit 40. FIG. 3 is a graph showing an output waveform of the conventional output buffer circuit 40. A broken line in FIG. 3 shows an output waveform when the sizes of the predrivers 43 and 44 are increased to reduce the signal-propagation delay time in the conventional output buffer circuit 40. As shown in FIG. 3, ringing is increased in the output voltage waveform.

As described above, in the conventional output buffer circuit in which the time difference is provided between the driving timings of the two CMOS inverters, when the sizes of the predrivers are increased to reduce the signal-propagation delay time, the noise occurring in the output signal is increased. As such, there occurs the problem of making it difficult to enhance the operating frequency by reducing the signal-propagation delay time.

SUMMARY OF THE INVENTION

Therefore, an object of the present invention is to provide an output buffer circuit that accomplishes both enhancement in operating frequency and maintenance of the output voltage level while restraining switching noise and ringing in an output voltage waveform.

In order to achieve an aspect of the present invention, the present invention provides an output buffer circuit including: a first output buffer section which includes complementary semiconductors; and a second output buffer section which includes complementary semiconductors and is connected in parallel with the first output buffer section, wherein the second output buffer section starts to output an second output signal after an output voltage of the output buffer circuit reaches a reference voltage indicative of one of an on-state and an off-state by a first output signal of the first output buffer section.

In the present invention, the output waveform of the output buffer circuit can rise or decay sharply by the first output buffer section thereby to improve the operating frequency, while the output voltage level of the output buffer circuit can reach the sufficient value by the second output buffer section. Hence, switching noise or ringing in the output waveform can be suppressed.

Thus, the output buffer circuit according to the invention accomplishes both enhancement in operating frequency and maintenance of the output voltage level while restraining switching noise and ringing in the output waveform.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Embodiments of an output buffer circuit according to the present invention will be described below with reference to the attached drawings.

First Embodiment

Figure 4:
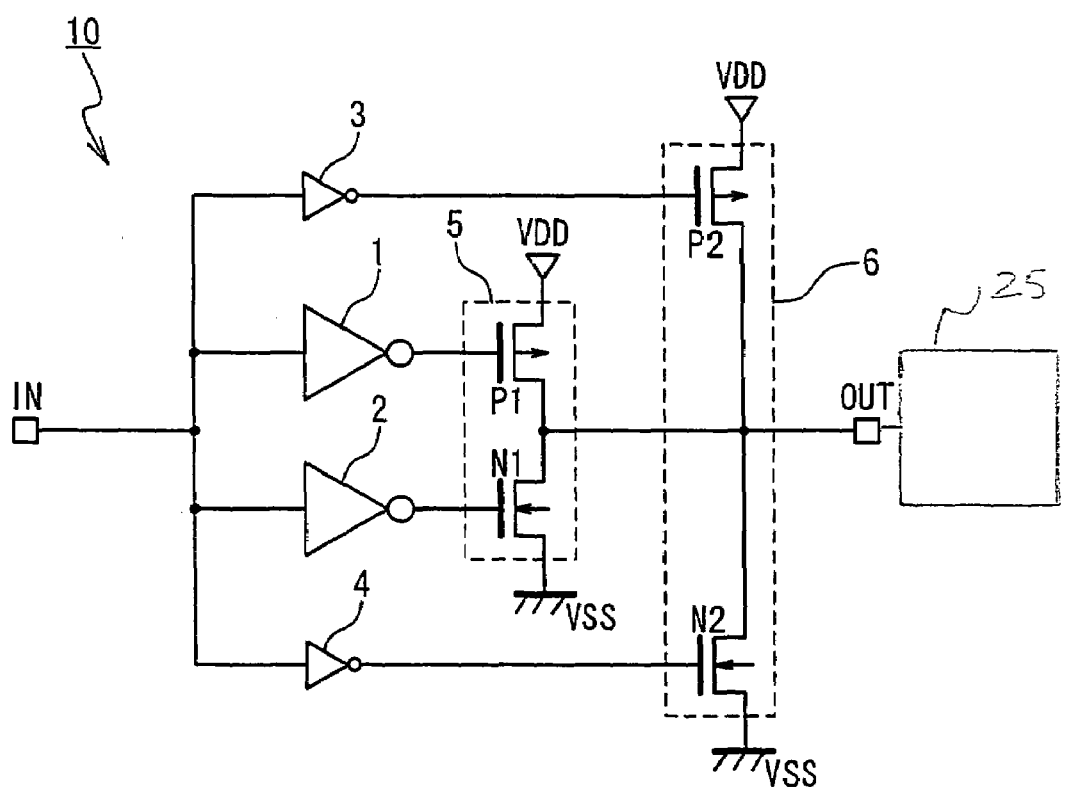
FIG. 4 is a circuit diagram showing an output buffer circuit according to a first embodiment of the present invention.

FIG. 4 is a circuit diagram showing an output buffer circuit 10 according to a first embodiment of the present invention. The output buffer circuit 10 includes predrivers 1 to 4, a first CMOS inverter 5 and a second CMOS inverter 6. The first CMOS inverter 5 includes a P-channel MOS transistor P1 and an N-channel MOS transistor N1. The second CMOS inverter 6 includes a P-channel MOS transistor P2 and an N-channel MOS transistor N2. An input terminal IN is connected to input terminals of the predrivers 1 to 4, which are inverter circuits. An output terminal of the predriver 1 is connected to the gate of the P-channel MOS transistor P1. An output terminal of the predriver 2 is connected to the gate of the N-channel MOS transistor N1. The P-channel MOS transistor P1 and the N-channel MOS transistor N1 constitute the first CMOS inverter 5 (first main buffer). An output terminal of the predriver 3 is connected to the gate of the P-channel MOS transistor P2. An output terminal of the predriver 4 is connected to the gate of the N-channel MOS transistor N2. The P-channel MOS transistor P2 and the N-channel MOS transistor N2 constitute the second CMOS inverter 6 (second main buffer). As shown by the different shape sizes of the inverters in FIG. 4, each of the predrivers 1 and 2 has a higher electric current driving capacity than each of the predrivers 3 and 4. The sources of the P-channel MOS transistors P1 and P2 are connected to a power-supply terminal VDD, and the drains thereof are connected to an output terminal OUT. The sources of the N-channel MOS transistors N1 and N2 are connected to a ground terminal VSS, and the drains thereof are connected to the output terminal OUT. A circuit 25 is connected to the output terminal OUT and driven by the output buffer circuit.

Except for the case that the external load being driven is extremely low, the sizes of the transistors P1 and N1 are smaller than those of the transistors P2 and N2. More specifically, it is sufficient that each of the transistors P1 and N1 has a minimum size necessary to cause the output voltage of the output buffer circuit to reach, within a predetermined time, a reference voltage indicative of one of ON (an on-state) and OFF (an off-state) of a circuit being connected to an output terminal. The reference voltage hereinafter will be referred to as "reference voltage indicative of ON or OFF". For example, the reference voltage indicative of ON or OFF is a threshold voltage at which a P-channel MOS transistor or an N-channel MOS transistor of a circuit being connected to the output terminal turns ON. On the other hand, it is sufficient that each of transistors P2 and N2 has a sufficiently large size to satisfy a predetermined output voltage level, excepting the contribution of the transistors P1 and N1.

The predrivers 1 and 2, respectively, drive the P-channel MOS transistors P1 and the N-channel MOS transistor N1 independently of each other such that the rising and the falling of the outputs of the transistors P1 and N1 cause the output voltage of the output buffer circuit to become the reference voltage indicative of ON or OFF within the predetermined time. On the other hand, the predrivers 3 and 4 drive the respective transistors P2 and N2 independently of each other. The transistors P2 and N2 are output buffers for satisfying a predetermined output voltage level, and start outputting after the transistors P1 and N1 operate and the output voltage of the output buffer circuit is stabilized at "H" or "L". The transistors P2 and N2 do not influence the operating frequency and the signal-propagation delay time of the output signal. The transistors P2 and N2 are provided to prevent the voltage of the output terminal OUT that has once exceeded the reference voltage from being dropped below the reference voltage by the operation of a circuit or the like connected to the output terminal. Therefore, the predrivers 3 and 4 should, be operated with a delay to the operation of the predrivers 1 and 2, so that the predrivers 3 and 4 are preferably small in size to slowly activate (charge and discharge) the gates of the transistors P2 and N2.

Differences between the output buffer circuit 10 according to the present embodiment and the conventional output buffer circuit 40 are described herebelow. First, the CMOS inverter 5 is formed large to the size necessary to cause the first CMOS inverter 5 to reach the reference voltage indicative of ON or OFF, and residual capacitance is allocated to the second CMOS inverter 6. Consequently, the CMOS inverter 5 is larger in size as compared to the CMOS inverter 45, and the CMOS inverter 6 is smaller in size as compared to the CMOS inverter 46. In addition, the predrivers 1 and 2 have a higher driving capacity than the predrivers 41 and 42 in order to drive the CMOS inverter 5 so that the output voltage of the output buffer circuit reaches the reference voltage indicative of ON or OFF within the predetermined time. Further, the predrivers 3 and 4 are only to drive the CMOS inverter 6 to be activated at low speed, so that the driving capacities of the predrivers 3 and 4 are lower than that of the predriver 42. That is, the predrivers 1 and 2 have a high electric current driving capacities to charge and discharge the gate capacitances of the CMOS inverter 5 at high speed. The predrivers 3 and 4 have a lower electric current driving capacities than the predrivers 1 and 2 to slowly charge and discharge the gate capacitances of the CMOS inverter 6. Since the electric current driving capacity of the CMOS inverter 5 is lower than that of the CMOS inverter 6, the gate capacitance is also set small. Further, for the predrivers 1 and 2, the electric current supply capacity can be set to be high by providing a plurality of parallel-connected inverters. For predrivers 3 and 4, the electric current supply capacity can be set to be low by, for example, providing a fewer number of parallel-connected inverters than those for the predrivers 1 and 2 or by increasing individual gate lengths L of the transistors.

Figure 5A:
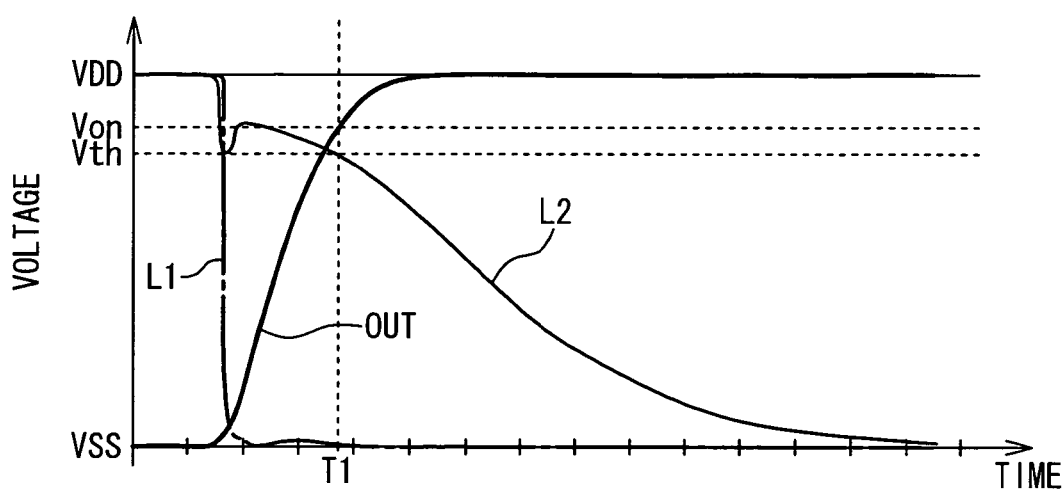
FIGS. 5A and 5B are graphs showing output waveforms representing operation of the output buffer circuit according to the present invention.
Figure 5B:
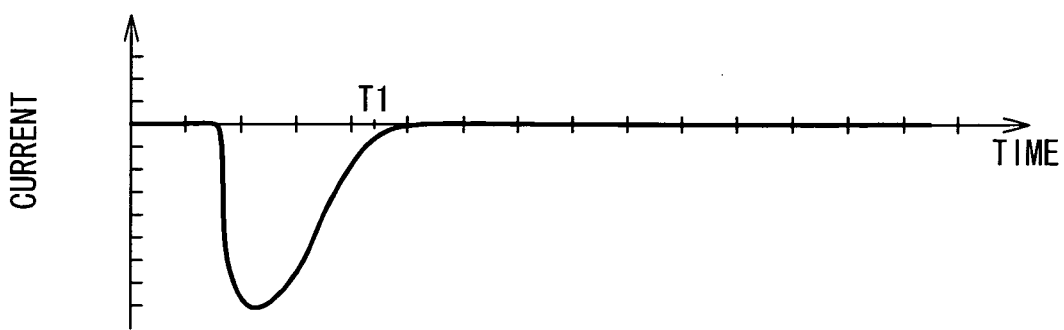

Operation of the output buffer circuit 10 according to the present invention will be described below with reference to FIGS. 5A and 5B. FIGS. 5A and 5B are graphs showing output waveforms representing operation of the output buffer circuit according to the present invention. In FIG. 5A, a vertical axis indicates a voltage, and a horizontal axis indicates a time. FIG. 5A shows output voltage waveforms of the predrivers 1 and 3 (gate input waveforms of the transistors P1 and P2) when the input signal to the input terminal IN has transitioned from "L" (VSS (ex. 0 V) in FIG. 5A) to "H" (VDD (ex. +5 V) in FIG. 5A). FIG. 5A further shows an output waveform that can be obtained by combining outputs of transistors P1 and P2. In this figure, L1 represents an output waveform of the predriver 1, L2 represents an output waveform of the predriver 3, and OUT represents an output waveform obtainable by combining outputs of the transistors P1 and P2. Von represents a reference voltage at which the output voltage of the output buffer circuit 10 turns ON, Vth represents a threshold voltage of a gate voltage necessary for the CMOS inverters 5 and 6 to start driving. Upon transition of the input signal of the input terminal IN from "L" to "H", outputs of the predrivers 1 and 3 (inverter circuits) transition from "H" to "L". In this event, the output waveform of the first predriver 1 represented by L1 is transitioned more abruptly as compared with the waveform of the conventional predriver 41 shown in FIG. 2A. Further, the output waveform of the second predriver 3 represented by L2 is transitioned more slowly as compared with the waveform of the conventional predriver 43 shown in FIG. 2A.

As shown in FIG. 5A, the first CMOS inverter 5 first starts driving, and then the output waveform OUT reaches the Von level at time T1 based on the output of the first CMOS inverter 5. Time T1 at which the output waveform OUT reaches the Von level is earlier than the conventional one shown in FIG. 2A. On the other hand, at the time point of T1, the voltage represented by L2 and being applied to the gate of the second CMOS inverter 6 has not dropped to the threshold voltage Vth at which the second CMOS inverter 6 starts driving. More specifically, the second CMOS inverter 6 has not yet started driving at the time point T1 at which the output voltage (OUT) has reached the Von level, but starts outputting after passage of time T1. The output voltage (OUT) of the output buffer circuit 10 reaches the VDD level based on the output of the second CMOS inverter 6 that has started outputting after the passage of time T1. The output voltage (OUT) of the output buffer circuit 10 thus reaches the reference voltage indicative of ON or OFF based on the first CMOS inverter 5 to thereby determine the operating frequency. Accordingly, the second CMOS inverter 6, which starts outputting thereafter, does not contribute to the determination of the operating frequency, thereby enabling driving at low speed not to cause, for example, switching noise and ringing in the output voltage waveform.

Figure 1:
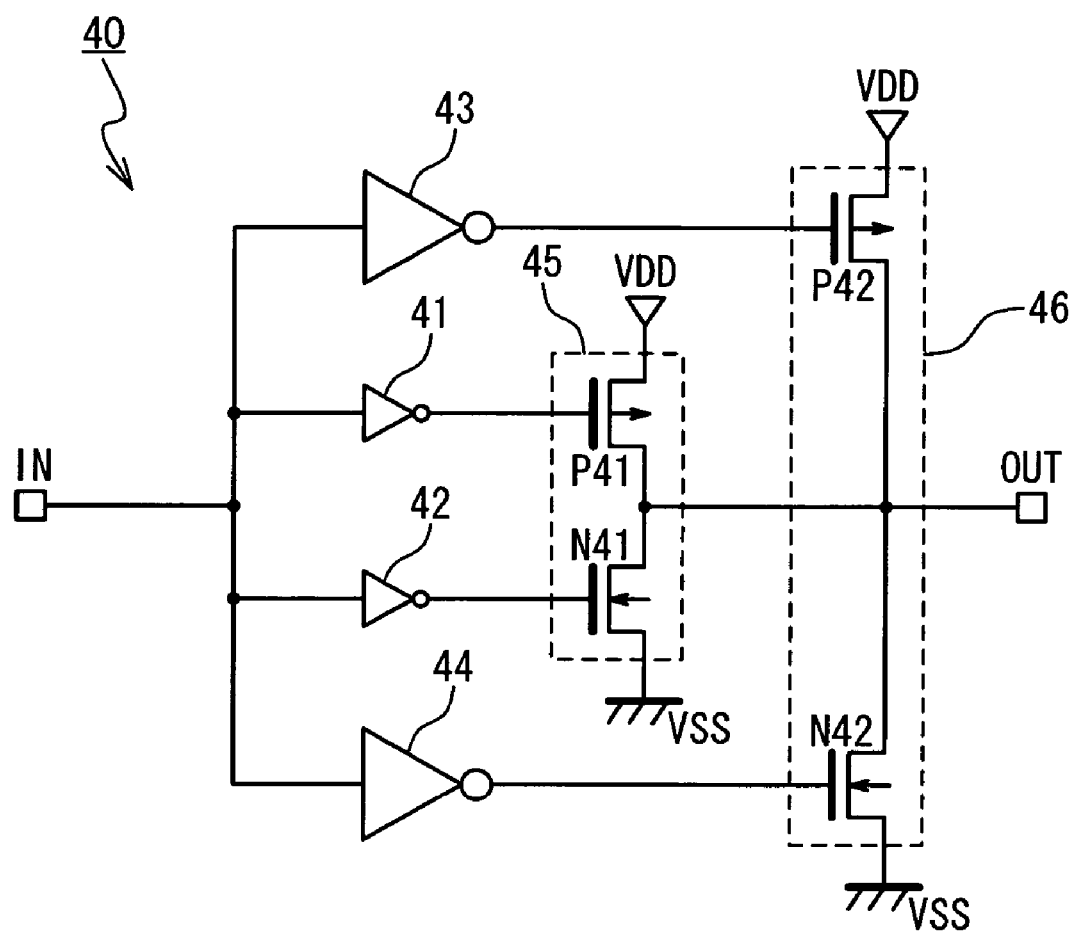
FIG. 1 is a circuit diagram showing an example of a conventional output buffer circuit.
Figure 2A:
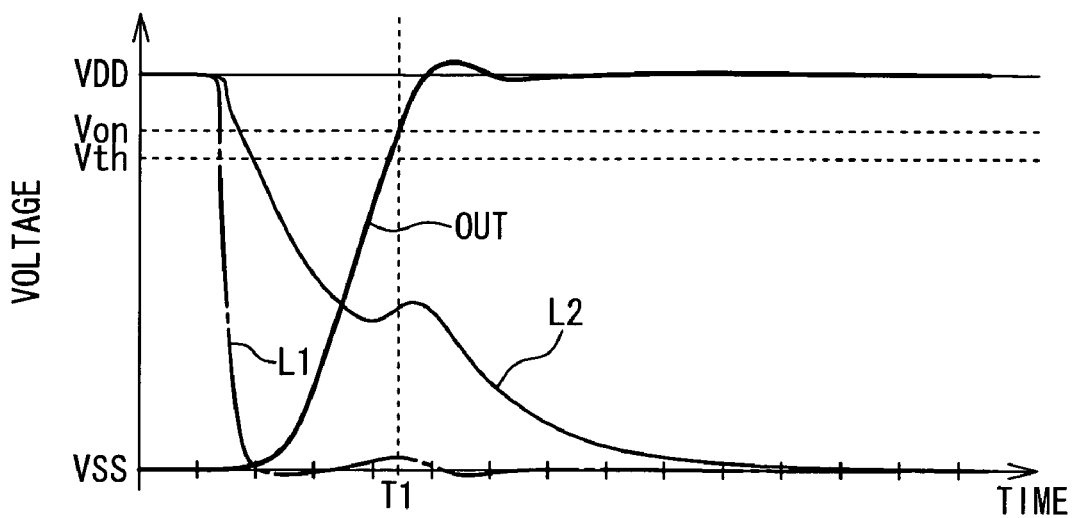
FIGS. 2A and 2B are graphs showing output waveforms representing operation of the conventional output buffer circuit.
Figure 3:
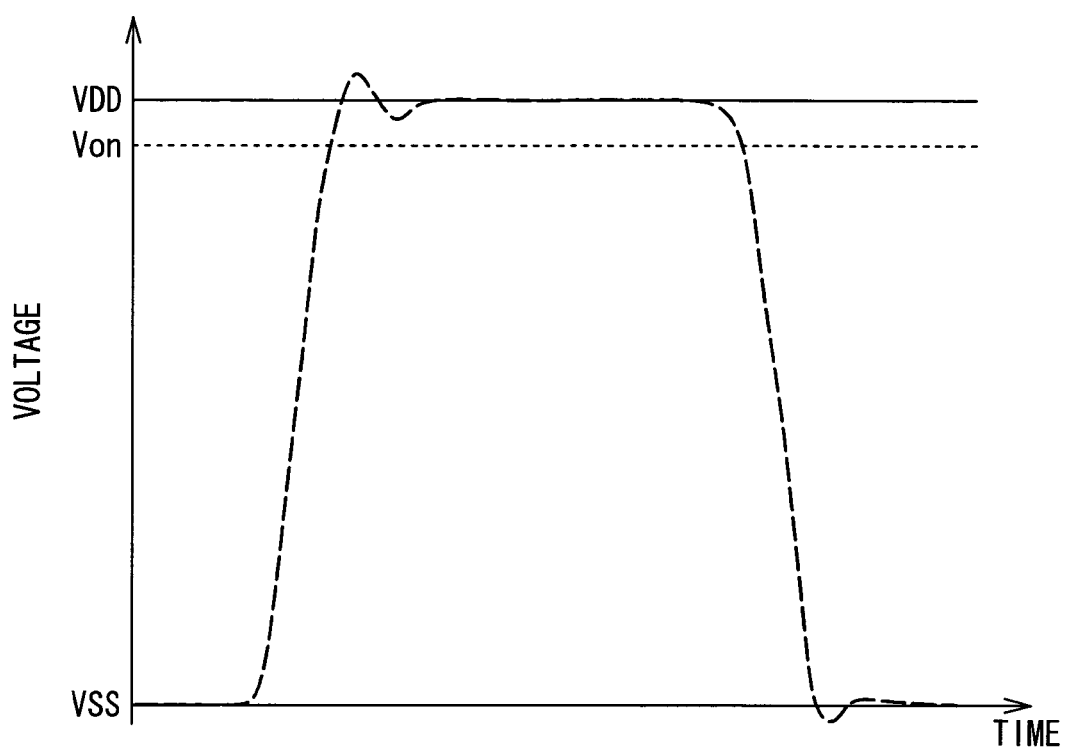
FIG. 3 is a graph showing an output waveform of the conventional output buffer circuit.
Figure 6:
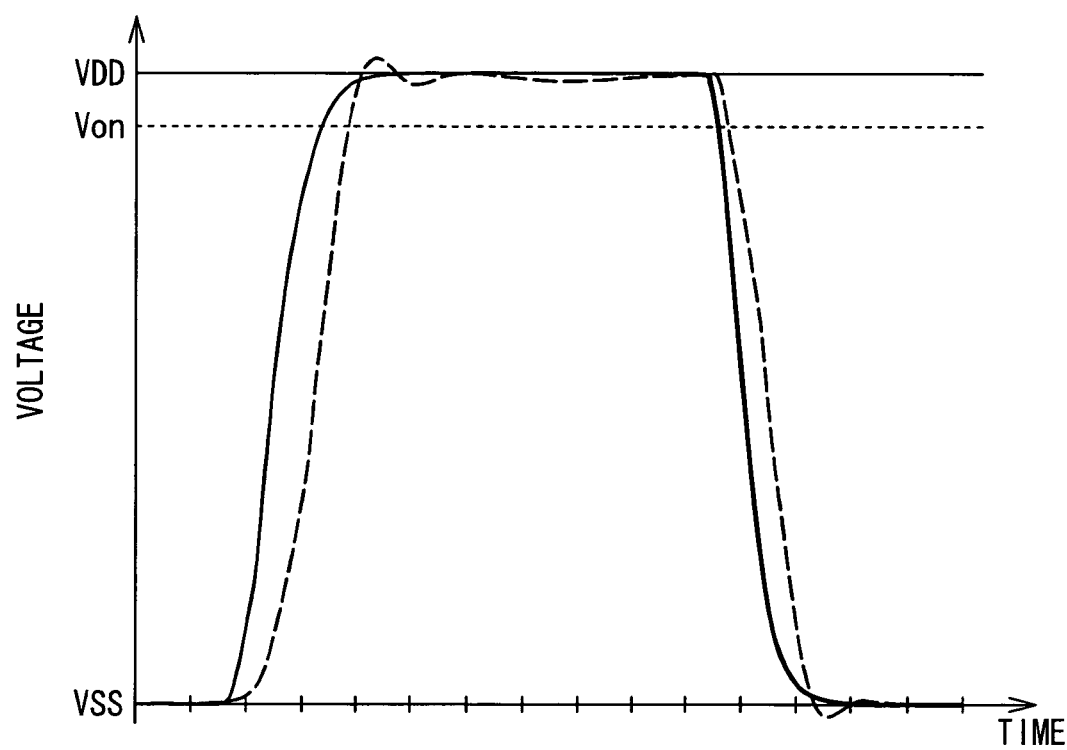
FIG. 6 is a graph showing output waveforms of the output buffer circuits of the conventional technique and the present invention.

According to the above explanation, compared to the conventional output waveform described by using FIG. 2A, the signal-propagation delay time until the output waveform OUT of the output buffer circuit is reduced, and in addition, the ringing generated in the conventional output waveform in the rising time is improved. FIG. 6 is a graph showing output waveforms of the output buffer circuits 40 and 10. This graph shows the output waveform of the conventional output buffer circuit 40 shown in FIG. 3 (broken line) and the output waveform of the output buffer circuit 10 (solid line) according to the present embodiment for comparison with the prior art example.

Figure 2B:
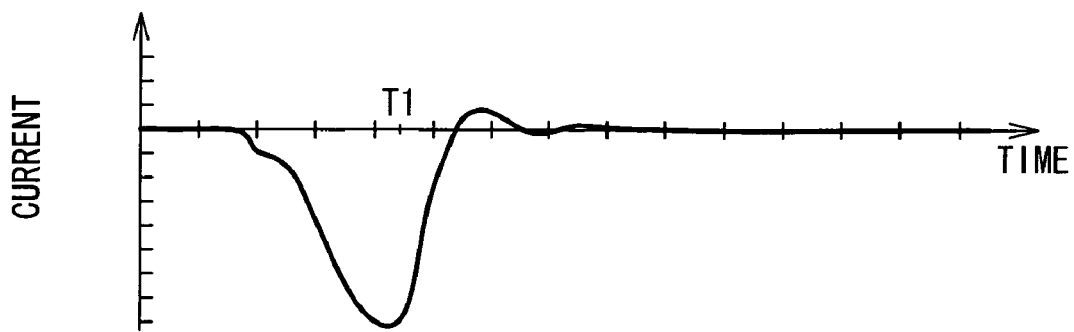

FIG. 5B is a graph showing output electric current characteristic of the output signal during the operation shown in FIG. 5A of the output buffer circuit 10. In FIG. 5B, a vertical axis indicates an electric current, and a horizontal axis indicates a time. As shown in this figure, the electric current peak value of the output signal and the electric current variation rate in the present embodiment are similar to those shown in FIG. 2B. Accordingly, even when the signal-propagation delay time is reduced in the output buffer circuit according to the present embodiment, no increase in the switching noise occurs.

Figure 7:
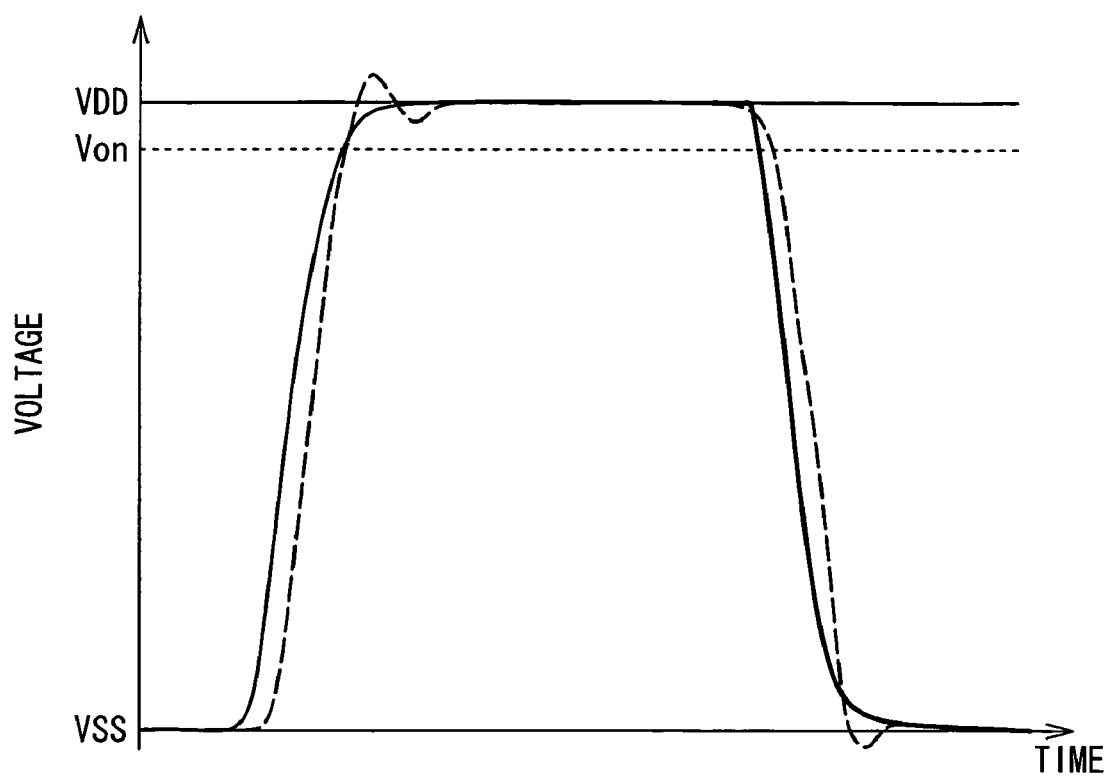
FIG. 7 is a graph showing output waveforms of the output buffer circuits of the conventional technique and the present invention.

FIG. 7 is the graph for comparison between the output waveform of the conventional output buffer circuit 40, in which the sizes of the predrivers 43 and 44 are increased for reducing the signal-propagation delay time to substantially the same level as that in the output buffer circuit 10 according to the present embodiment, and the output waveform of the output buffer circuit 10 according to the present embodiment. The waveform shown by the solid line is the output waveform of the output buffer circuit 10 according to the present embodiment, and the waveform shown by the broken line is the output waveform of the conventional example. As shown in this figure, the ringing at the rising time is increased in the output waveform of the conventional output buffer circuit 40. On the other hand, the reduction in the signal-propagation delay time can be accomplished without causing ringing in the output buffer circuit 10 according to the present invention.

In the present embodiment, it is preferable that the predrivers 1 and 2 are configured independent and different of each other such that the P-channel MOS transistor P1 and the N-channel MOS transistor N1 of the CMOS inverter 5 are not turned on at the same time by differentiating the timings from each other. This is because when being driven by the same predriver, a time period occurs in which the P-channel MOS transistors and the N-channel MOS transistor turn ON at the same time. For the same reason, it is preferable that also the predrivers 3 and 4 have configurations independent and different of each other.

Second Embodiment

The first embodiment describes the configuration including the predrivers 1 to 4 for driving the respective transistors P1, N1, P2, and N2 of the CMOS inverters 5 and 6. The second embodiment will be described with reference to attached drawings.

Figure 8:
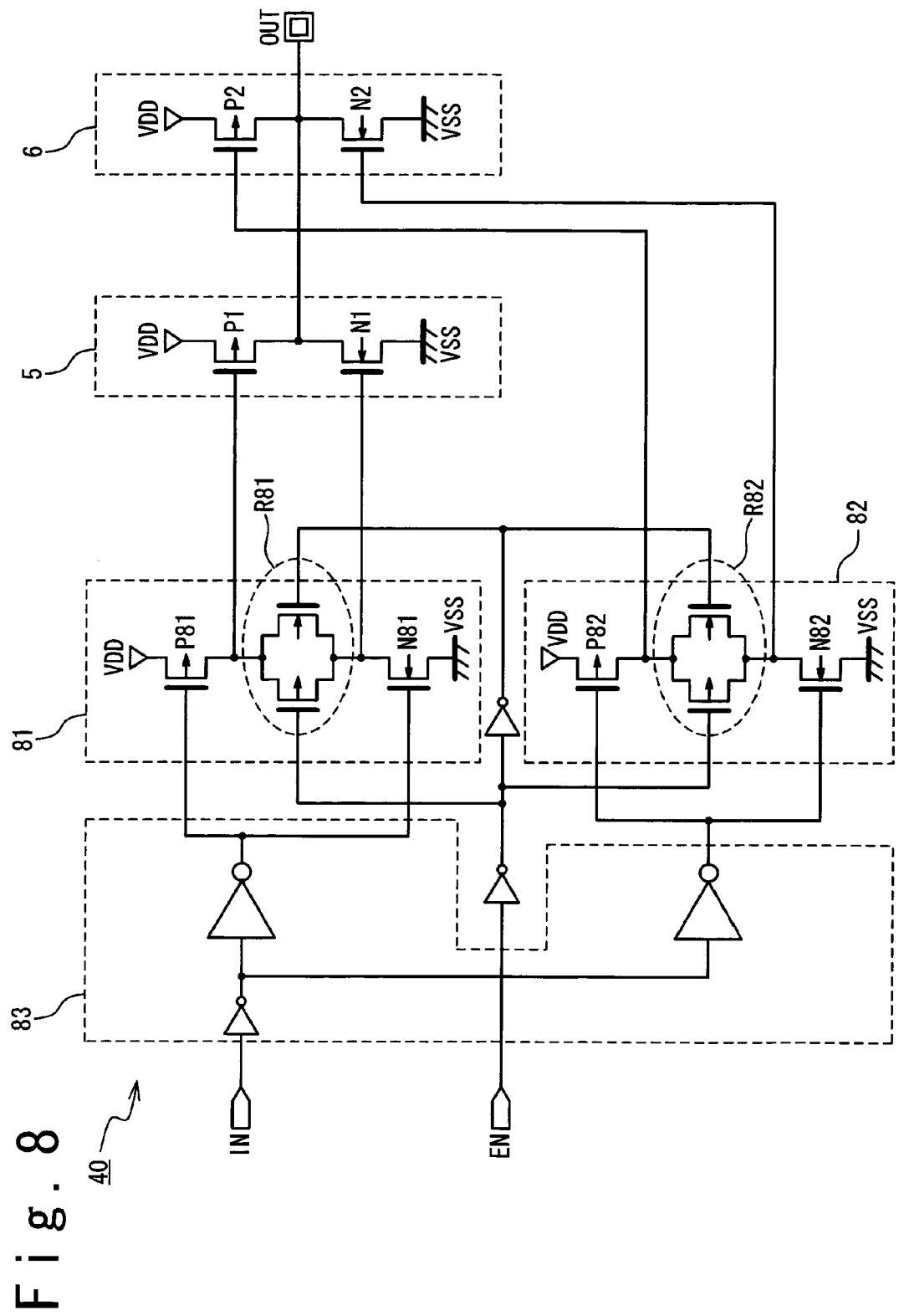
FIG. 8 is a circuit diagram showing an output buffer circuit according to a second embodiment of the present invention.

FIG. 8 is a circuit diagram showing an output buffer circuit 80 according to a second embodiment of the present invention. The output buffer circuit 80 includes the CMOS inverters 5 and 6, predrivers 81 and 82, and a buffer 83. In the present embodiment, since the individual configurations of the CMOS inverters 5 and 6 are the same as those described above, description thereof will be omitted herefrom, and the predrivers 81 and 82 having different configurations therefrom and the buffer 83 will be described herebelow with reference to FIG. 8.

The predriver 81 includes a P-channel MOS transistor P81, a resistance element R81, and an N-channel MOS transistor N81 which are series connected between the power-supply terminal VDD and the ground terminal VSS. The gates of the P-channel MOS transistor P81 and the N-channel MOS transistor N81 are connected through the buffer 83 to an input terminal IN to which input signals are supplied. A node between the P-channel MOS transistor P81 and the resistance element R81 is connected to the gate of the P-channel MOS transistor P1 of the CMOS inverter 5. A node between the N-channel MOS transistor N81 and the resistance element R81 is connected to the gate of the N-channel MOS transistor N1 of the CMOS inverter 5. Similarly, the predriver 82 includes a P-channel MOS transistor P82, a resistance element R82, and an N-channel MOS transistor N82 which are series connected between the power-supply terminal VDD and the ground terminal VSS. The gates of the P-channel MOS transistor P82 and the N-channel MOS transistor N82 are connected through the buffer 83 to the input terminal IN. A node between the P-channel MOS transistor P82 and the resistance element R82 is connected to the gate of the P-channel MOS transistor P2 of the CMOS inverter 6. A node between the N-channel MOS transistor N82 and the resistance element R82 is connected to the gate of the N-channel MOS transistor N2 of the CMOS inverter 6.

In this case, it is assumed that the resistance value of the resistance element R82 is set higher than that of the resistance element R81, and the electric current supply capacity (charge-discharge capacity) is controlled by the resistance element R82. In addition, in the present embodiment, a transfer gate formed of a CMOS transistor pair having a large gate length is used for the resistance element. Activation/deactivation of the transfer gate is performed by an enable signal EN. The operation will be described herebelow.

When an input signal IN of the input terminal is "L", the P-channel MOS transistor P81 of the predriver 81 is ON and the N-channel MOS transistor N81 thereof is OFF. Therefore, the gate of the P-channel MOS transistor P1 of the CMOS inverter 5 becomes "H" and the gate of the N-channel MOS transistor N1 becomes "L", whereby "H" (signal) is output to an output terminal OUT. Similarly, based on the input signal IN of the input terminal is "L", the P-channel MOS transistor P82 of the predriver 82 is ON and the N-channel MOS transistor N82 thereof is OFF. Therefore, the gate of the P-channel MOS transistor P2 of the CMOS inverter 6 becomes "H" and the gate of the N-channel MOS transistor N2 becomes "L", whereby "H" is output to an output terminal OUT.

When the input signal has transitioned from the above-described "L" to "H", the P-channel MOS transistor P81 of the predriver 81 becomes OFF and the N-channel MOS transistor N81 becomes ON. As a consequence, the gate of the N-channel MOS transistor N1 of the CMOS inverter 5 is connected to the ground terminal VSS through the N-channel MOS transistor N81, and then, the N-channel MOS transistor N1 quickly becomes OFF. Since the gate of the P-channel MOS transistor P1 is connected to the ground terminal VSS through the resistance element R81 and the N-channel MOS transistor N81, the charge is drawn out by the electric current supply capacity drawn in by the resistance element R81 and the gate of the P-channel MOS transistor P1 becomes "L". Therefore, the output of the CMOS inverter 5 becomes "H". Similarly, the P-channel MOS transistor P82 of the predriver 82 becomes OFF and the N-channel MOS transistor N82 becomes ON. As a consequence, the gate of the N-channel MOS transistor N2 of the CMOS inverter 6 is connected to the ground terminal VSS through the N-channel MOS transistor N82, and then, the N-channel MOS transistor N2 quickly becomes OFF. Since the gate of the P-channel MOS transistor P2 is connected to the ground terminal VSS through the resistance element R82 and the N-channel MOS transistor N82, the charge is drawn out by the electric current supply capacity drawn in by the resistance element R82 and the gate of the P-channel MOS transistor P2 becomes "L" with a delay corresponding to the difference of the electric current supply capacity from the P-channel MOS transistor P1. Therefore, the output of the CMOS inverter 6 becomes "H".

As described above, based on the control of the individual resistance values of the resistance elements R81 and R82, the P-channel MOS transistor and the N-channel MOS transistor constituting the CMOS inverter 5 can easily be prevented from being put to the ON state at the same time. Similarly, the P-channel MOS transistor and the N-channel MOS transistor constituting the CMOS inverter 6 can easily be prevented from being put to the ON state at the same time. In addition, based on the control of the resistance values, the timing with which the P-channel MOS transistor or the N-channel MOS transistor of the CMOS inverter 5 turns ON and the timing with which the P-channel MOS transistor or the N-channel MOS transistor of the CMOS inverter 6 turns ON can easily be harmonically collated with each other corresponding to the ON or OFF reference voltage of the circuit being connected to the output terminal OUT, as described in the first embodiment. That is, since the output voltage of the output buffer circuit 10 reaches the reference voltage indicative of ON or OFF by the predriver 81 thereby to determine the operating frequency, the predriver 82 that starts outputting thereafter does not contribute to the determination of the operating frequency, consequently enabling driving at a low speed not to cause switching noise or ringing in the output voltage waveform.

Figure 9:
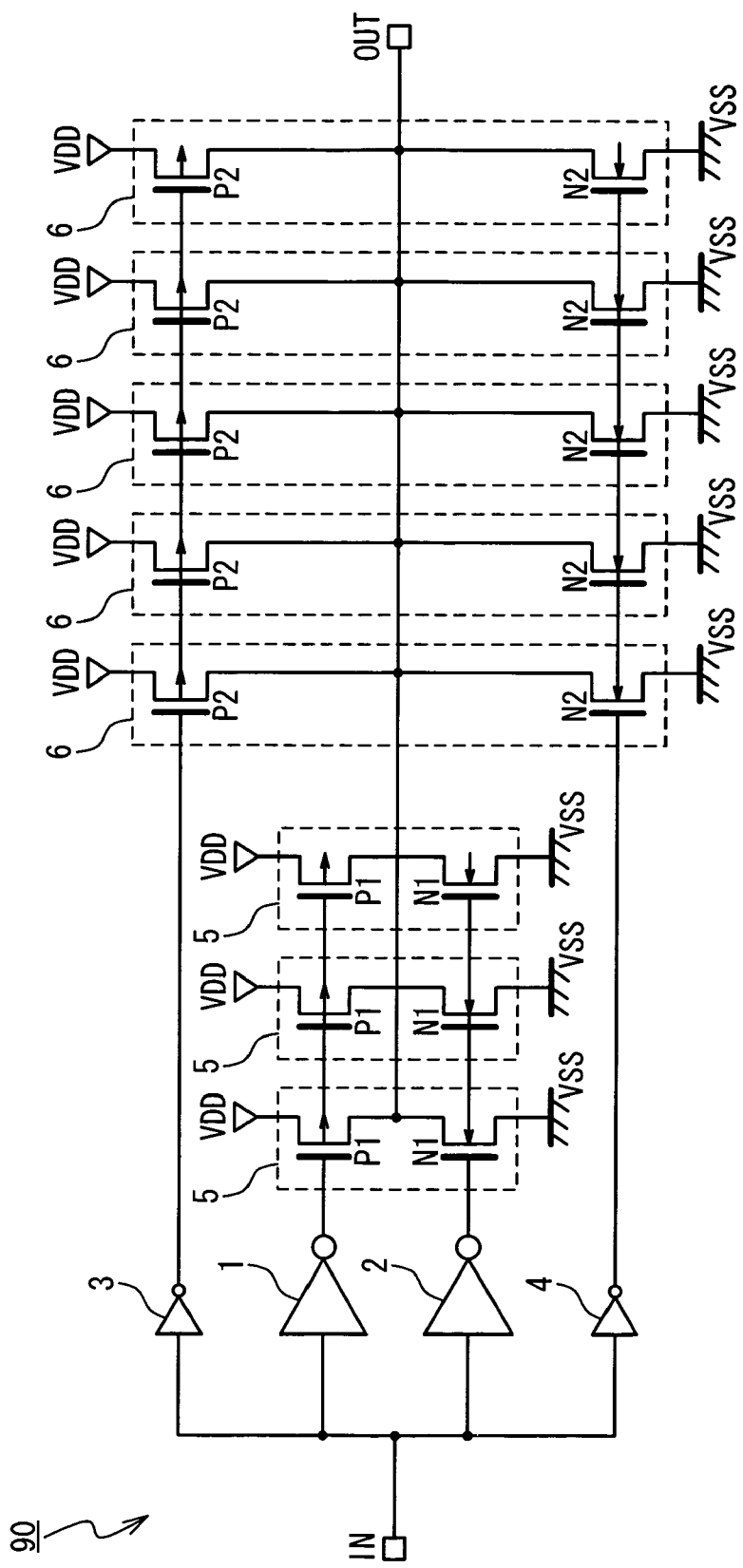
FIG. 9 is a circuit diagram showing a variation of the output buffer circuit according to the present invention.

In the above-described embodiment, the case is described, in which the first buffer unit is configured of the single CMOS inverter 5 and the second buffer unit is configured of the single second CMOS inverter 6. However, the buffer units may each have a configuration in which a plurality of CMOS inverters is series connected each other. FIG. 9 is a circuit diagram showing a variation of the output buffer circuit according to the present invention. The output buffer circuit 90 includes a first buffer unit configured of three series-connected CMOS inverters 5 and a second buffer unit configured of five series-connected CMOS inverters 6.

Further, in the above-described embodiment, the case is described, in which the output transitions from "L" to "H". However, the embodiment is also adaptable to a case where the output transitions from "H" to "L".

The size of the CMOS inverter 5 is preferably as small as possible within a range necessary to cause the output voltage of the output buffer circuit 10 to reach the reference voltage indicative of ON or OFF within a required operation delay time. Thereby, the rising or falling time of the output voltage can be reduced, thereby enabling adaptation for further improvement in the operating frequency.

Further, in the above-described embodiment, the case is described, in which the number of parallel arrangements of output buffers is two. However, it may be available to use the configuration of which the number of parallel arrangements of output buffers is three and the parallel-arranged output buffers are driven by independent predrivers.

It is apparent that the present invention is not limited to the above embodiment, that may be modified and changed without departing form the scope and spirit of the invention.

What is claimed is:

1. An output buffer circuit comprising:
an input terminal for receiving a input signal;
a first output buffer section including complementary semiconductors and outputting a first output signal corresponding to said input signal;
a second output buffer section including complementary semiconductors and connected in parallel with said first output buffer section,
wherein said second output buffer section starts to output a second output signal corresponding to said input signal after said first output signal corresponding to said input signal reaches a reference voltage Von to decide whether an output voltage of said output buffer circuit is on-state or off-state;
a first predriver section receiving said input signal and applying a first gate voltage to a control terminal of said first output buffer section; and
a second predriver section receiving said input signal and applying a second gate voltage to a control terminal of said second output buffer section,
wherein said first gate voltage crosses through a voltage level of a threshold voltage of said first output buffer section in response to a voltage change of said input signal before said output voltage of said output buffer circuit reaches said reference voltage Von in response to the voltage change of said input signal, and
said second gate voltage crosses through a voltage level of a threshold voltage of said second output buffer section in response to the voltage change of said input signal after said output voltage of said output buffer circuit reaches said reference voltage Von in response to the voltage change of said input signal.

2. The output buffer circuit according to claim 1, wherein a difference between time when said first output buffer section starts to output said first output signal and time when said second output buffer section starts to output said second output signal are generated based on a difference between a driving capacity of said first predriver section and a driving capacity of said second predriver section.

3. The output buffer circuit according to claim 2, wherein said first output buffer section includes:
a first p-type transistor, and
a first n-type transistor,
said first predriver section includes:
a first inverter circuit which drives said first p-type transistor, and
a second inverter circuit which drives said first n-type transistor,
said second output buffer section includes:
a second p-type transistor, and
a second n-type transistor,
said second predriver section includes:
a third inverter circuit which drives said second p-type transistor, and
a fourth inverter circuit which drives said second n-type transistor.

4. The output buffer circuit according to claim 1, wherein a size of each of said complementary semiconductors of said first output buffer section is set such that said output voltage of said output buffer circuit reaches said reference voltage in a predetermined time by said first output signal of said first output buffer section, and
a size of each of said complementary semiconductors of said second output buffer section is set such that said output voltage of said output buffer circuit reaches one of a power source voltage and a ground voltage by said first output signal of said first output buffer section and said second output signal of said second output buffer section.

5. The output buffer circuit according to claim 1, wherein a current supplying capacity of said second output buffer section is larger than a current supplying capacity of said first output buffer section.

6. The output buffer circuit according to claim 1, wherein both said first output buffer section and said second output buffer section are CMOS inverters.

7. The output buffer circuit according to claim 1, wherein said threshold voltage of said first output buffer section is a voltage that said first output buffer section starts driving, and said threshold voltage of said second output buffer section is a voltage that said second output buffer section starts driving.

8. An output buffer circuit comprising:
a first output buffer section which includes complementary semiconductors;
a second output section which includes complementary semiconductors and is connected in parallel with said first output buffer section,
wherein said second output buffer section starts to output a second output signal after a first output signal of said first output buffer section reaches a reference voltage Von indicative of an on-state of an output voltage of said output buffer circuit;
a first predriver section which applies a voltage to a control terminal of said first output buffer section; and
a second predriver section which applies a voltage to a control terminal of said second output buffer section,
wherein a difference between time when said first output buffer section starts to output said first output signal and time when said second output buffer section starts to output said second output signal are generated based on a difference between a driving capacity of said first predriver section and a driving capacity of said second predriver section, and
wherein said driving capacity of said first predriver section is larger than said driving capacity of said second predriver section.

9. An output buffer circuit comprising:
a first output buffer which is connected with an output terminal and includes complementary semiconductors with first gate capacitance;
a second output buffer which is connected with said output terminal and includes complementary semiconductors with second gate capacitance larger than said first gate capacitance;
a first predriver which drives said first output buffer by a first current supplying capacity; and
a second predriver which drives said second output buffer by a second current supplying capacity smaller than said first current supplying capacity,
wherein said second current supplying capacity of said second predriver is set such that said second output buffer drives said output terminal when said first output buffer driven by said first predriver outputs a voltage at said output terminal that reaches a reference voltage Von indicative of one of an on-state and an off-state of said output buffer circuit.

10. The output buffer circuit according to claim 9, wherein both said first predriver and said second predriver are CMOS inverters.

11. The output buffer circuit according to claim 9, wherein said reference voltage is set based on a turn-on voltage of a circuit connected with said output terminal and driven by said output buffer circuit.

12. An output buffer comprising:
a first main buffer which includes:
a first transistor with a first conductive type, which is connected between a first power line and an output terminal, and
a second transistor with a second conductive type, which is connected between a second power line and said output terminal;
a second main buffer which has a larger current driving capacity than said first main buffer and includes:
a third transistor with the first conductive type, which is connected between said first power line and said output terminal, and
a fourth transistor with the second conductive type, which is connected between said second power line and said output terminal; and
a predriver which is connected between an input terminal and control terminals of said first, second, third and fourth transistors, changes a conducting state of one of said first and second transistors into a non-conducting state thereof rapidly, changes the non-conducting state of another of one of said first and second transistors into the conducting state thereof gradually, changes the conducting state of one of said third and fourth transistors into the non-conducting state thereof rapidly, and changes the non-conducting state of another of one of said third and fourth transistors into the conducting state thereof gradually, in response to an input signal supplied to said input terminal,
wherein said predriver makes one of said third and fourth transistors be in the conducting state after a voltage of said output terminal reaches a predetermined voltage level by a corresponding one of said first and second transistors,
wherein said predriver includes:
a first switching element which is connected between said first power line and a control terminal of said first transistor,
a first resistance element which is connected between said control terminal of said first transistor and a control terminal of said second transistor,
a second switching element which is connected between said control terminal of said second transistor and said second power line,
a third switching element which is connected between said first power line and a control terminal of said third transistor,
a second resistance element which is connected between said control terminal of said third transistor and a control terminal of said fourth transistor, and
a fourth switching element which is connected between said control terminal of said fourth transistor and said second power line,
said second resistance element has a larger resistance value than said first resistance element.

13. The output buffer according to claim 12, wherein both said first and second resistance elements are transfer gates.

14. The output buffer according to claim 12, wherein said first, second, third and fourth switching elements are transistors, each of which has said control terminal that receives said input signal.

15. The output buffer according to claim 12, wherein said first and third switching elements are transistors with said first conducting type, and said second and fourth switching elements are transistors with said second conducting type.

* * * * *